(12) United States Patent
Onde

(10) Patent No.: US 7,477,174 B2
(45) Date of Patent: Jan. 13, 2009

(54) METHOD FOR DIGITAL SAMPLING AND CORRESPONDING IMPLEMENTATION DEVICE

(75) Inventor: Vincent Onde, Mimet (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 11/761,304

(22) Filed: Jun. 11, 2007

(65) Prior Publication Data

US 2007/0297772 A1 Dec. 27, 2007

(30) Foreign Application Priority Data

Jun. 13, 2006 (FR) .................................. 06 05260

(51) Int. Cl.
*H03M 1/48* (2006.01)

(52) U.S. Cl. ...................... 341/111; 341/155

(58) Field of Classification Search .......... 341/122–160
See application file for complete search history.

(56) References Cited

U.S. PATENT DOCUMENTS

| 5,557,561 | A   |   | 9/1996 | Daleo et al. |
|-----------|-----|---|--------|--------------|
| 6,067,363 | A   | * | 5/2000 | Dent .......................... 341/155 |
| 7,209,065 | B2  | * | 4/2007 | Wood .......................... 341/155 |

FOREIGN PATENT DOCUMENTS

JP  8-181614  7/1996

OTHER PUBLICATIONS

Patents Abstracts of Japan, JP 8-181614, Dec. 7, 1996.
Preliminary French Search Report, FR 06 052620, dated Jan. 11, 2007.

* cited by examiner

*Primary Examiner*—Lam T Mai
(74) *Attorney, Agent, or Firm*—Gardere Wynne Sewell LLP

(57) ABSTRACT

A method for cadence detection in a sequence of video fields is based on at least a search for cadence patterns in a sequence of bits representative of the motion in at least a part of the field from one field to another in the field sequence. The signaling of field skip and/or field repeat commands as applied to the fields in the field sequence is considered during the cadence detection operation so as to field skips and repeats.

22 Claims, 2 Drawing Sheets

METHOD FOR DIGITAL SAMPLING AND CORRESPONDING IMPLEMENTATION DEVICE

PRIORITY CLAIM

This application is a translation of and claims priority from French Application for Patent No. 06 05260 of the same title filed Jun. 13, 2006, the disclosure of which is hereby incorporated by reference.

BACKGROUND OF THE INVENTION

1. Technical Field of the Invention

The present invention concerns the area of analog/digital signal conversion, and in particular the methods for sampling several analog signals with an analog/digital converter.

2. Description of Related Art

A method is known for measuring at least two analog signals, including at least one operation that consists of creating digital samples, at successive sampling instants and at least by means of a first analog/digital converter, representing the values taken respectively by these signals at these sampling instants. Such a method is well known to the professional engineer. It is employed, for example, in motor monitoring applications for three-phase motors.

The problem is to be able to measure, and convert into digital form, the simultaneous value of at least two analog signals.

To this end, certain solutions of previous design aim to use and synchronize at least two converters, with each converter measuring one signal.

However such solutions are particularly costly and are not satisfactory in terms of size at the silicon level. Moreover, in this area, it is preferable to have no more than one analog/digital converter.

Now by its nature, a single converter cannot be used to effect several measurements simultaneously. Two successive measurements of a given signal, or of two different signals, can be achieved only with a time offset between these measurements.

Moreover, the time offset between the measurements, with the use of a single converter, introduces inaccuracy into the measurements when they are considered to be simultaneous.

For example, in the context of motor monitoring applications for balanced three-phase motors, it is no longer possible to operate on the basic assumption that the sum of the three currents is zero at a given instant with a single converter, and if this assumption is nevertheless considered to be true with measurements that are offset in time, then that introduces inaccuracy into the measurements for monitoring the motor, and a potential drop in its performance.

In order to overcome these effects, there do exist certain solutions aiming to compensate, by software, for the offset between two successive measurements, but they are particularly complex to implement and require the measurement or the evaluation of other parameters.

There is a need to remedy these drawbacks by proposing a method that is particularly simple to implement, and that aims to get around the constraint according to which a single converter is unable to effect several simultaneous measurements.

SUMMARY OF THE INVENTION

With this objective in view, a device performs operations comprising selectively supplying, at each sampling instant, either of the signals to the first converter for the creation of a corresponding original digital sample, and of combining at least two original digital samples, created for a first at least of the signals at respective sampling instants, in order to form, by interpolation, a derived digital sample representing the value taken by this first signal at a reference instant that is temporally offset in relation to each of the sampling instants of this first signal.

Using this method, a single analog/digital converter can be used, and by the creation of a multi-simultaneous sample-blocking behavior, the time offsets between two samples from one signal to the other are eliminated.

In one embodiment, the reference instant is a sampling instant of a second of the analog signals.

In one embodiment, the method also includes a stage performing combining at least two original digital samples, created for a second of the signals at respective sampling instants, in order to form, by interpolation, a derived digital sample representing the value taken by this second signal at the reference instant.

The interpolation is preferably linear, since this simplifies the calculations.

Advantageously, at least one of the sampling instants used for the interpolation is prior at the reference instant.

Preferably, a sequence comprising selectively supplying, at each sampling instant, either of the signals to the first converter for the creation of a corresponding original digital sample, is stored in memory resources, where the sequence is also capable of being modified dynamically.

In one embodiment, the memory resources include a set of registers of the first converter.

By way of an alternative, the memory resources include the RAM of a processor connected to the first converter by means of a controller (DMA).

The method is advantageously used to monitor the phase currents of a balanced three-phase device at a reference instant.

According to another embodiment, a device is capable of implementing the method described above.

To this end, the device includes resources for measuring at least two analog signals, configured to execute at least one operation that consists of creating, at successive sampling instants and at least by means of a first analog/digital converter, digital samples representing the values taken respectively by these signals at these sampling instants.

The device further comprises resources to selectively supply, at each sampling instant, either of the signals to the first converter for the creation of a corresponding original digital sample, and resources to combine at least two original digital samples, created for a first at least of the signals at respective sampling instants, in order to form, by interpolation, a derived digital sample representing the value taken by this first signal at a reference instant that is temporally offset in relation to each of the sampling instants of this first signal.

From the physical viewpoint, the size of the microcontroller that includes the converter is minimal, since a single converter can be used.

The functionality with which an analog/digital converter dual with a single analog/digital converter is emulated increases the operational flexibility of the analog/digital converter.

In accordance with another embodiment, a method for measuring at least two analog signals using only a single analog/converter, comprises: sampling a first one of the analog signals at a first instant in time to generate by the single analog/digital converter a first digital value; sampling a second one of the analog signals at a second instant in time to generate by the single analog/digital converter a second digital value; sampling the first one of the analog signals at a third instant in time to generate by the single analog/digital converter a third digital value; and interpolating the first and third digital values relating to sampling of the first one of the analog signals at the first and third instants in time to derive a fourth digital value representing a sampling of the first one of the analog signals at about the second instant in time.

An embodiment further comprises a device which implements the foregoing method.

In accordance with another embodiment, a method for measuring at least two analog signals using only a single analog/converter comprises: sampling a first one of the analog signals at a first and a second instants in time to generate by the single analog/digital converter a first and second digital value, respectively; sampling a second one of the analog signals at a third and a fourth instants in time to generate by the single analog/digital converter a third and a fourth digital value, respectively; first interpolating the first and second digital values relating to sampling of the first one of the analog signals at the first and second instants in time to derive a fifth digital value representing a sampling of the first one of the analog signals at a reference instant in time; and second interpolating the third and fourth digital values relating to sampling of the second one of the analog signals at the third and fourth instants in time to derive a sixth digital value representing a sampling of the second one of the analog signals at about the same reference instant in time.

An embodiment further comprises a device which implements the foregoing method.

BRIEF DESCRIPTION OF THE DRAWINGS

Other characteristics and advantages will become more clear after reading the following description given as an illustrative and non-limitative example with reference to the appended figures, wherein.

DETAILED DESCRIPTION OF THE DRAWINGS

This methods and devices disclosed herein are employed advantageously for motor control in three-phase motors. The illustrated and described implementation is not limiting, but for reasons of clarity in this present description, will be the only one described here. The professional engineer will easily transpose the present information to other applications that require the simultaneous measurement of at least two analog signals.

Figure 1:
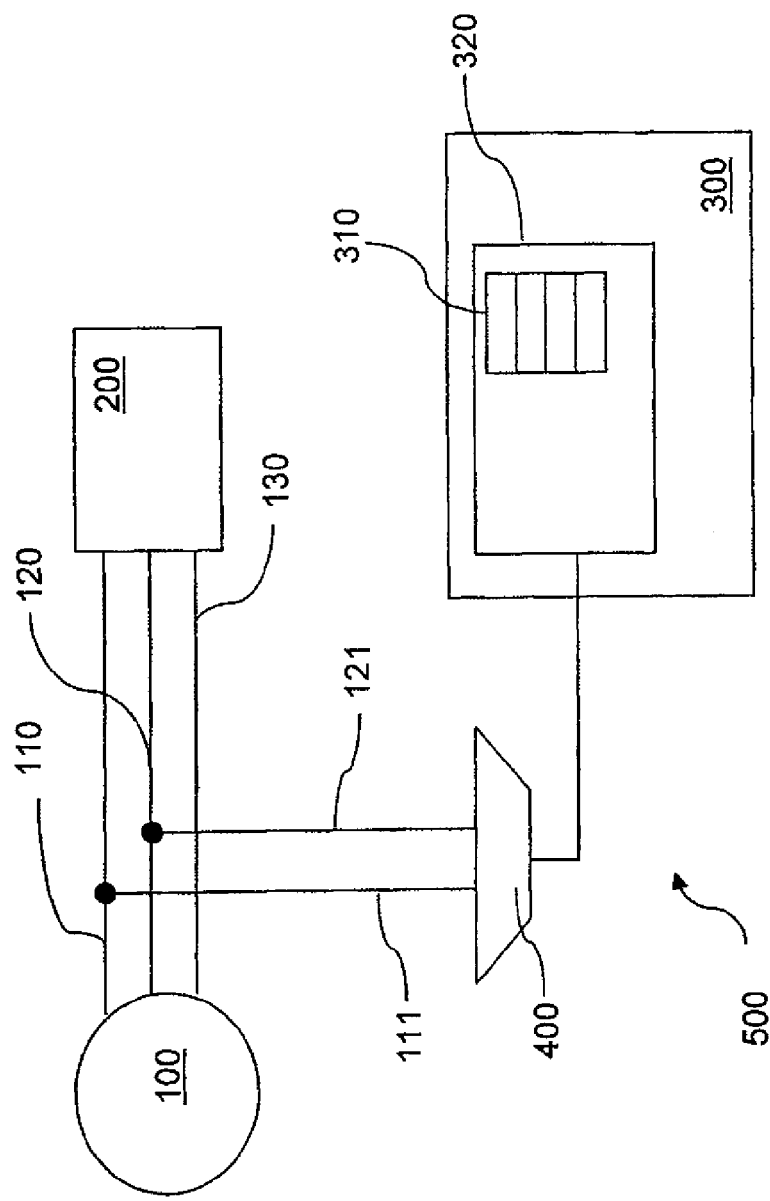
FIG. 1 is a schematic representation of one embodiment of a device.

FIG. 1 represents one embodiment of a device. A three-phase motor 100 is connected to a power converter 200 by means of a first line 110 carrying a first phase, a second line 120 carrying a second phase, and a third line 130 carrying a third phase.

A problems exists in terms of measuring the current flowing in the motor, preferably with a single converter.

In the context of a balanced motor, the three phases of the motor 100 are identical, which advantageously allows the measurement of only two phases, and deduction of the third.

The current varies rapidly in a motor, and it is therefore preferable to effect measurements as instantaneously as possible.

A single converter cannot be used to effect several simultaneous instantaneous measurements, and so a solution described herein comprises constructing a single instantaneous measurement from sequential measurements.

Referring FIG. 1, the solution comprises measuring the current in the first 110 and second 120 lines of the motor 100. The value of the third phase is deduced from these two measurements, considering the motor 100 to be balanced.

To this end, the measuring device 500 includes a first measurement channel 111 connected to the first line 110, configured to transmit the value of a first signal C1, and a second measurement channel 121 connected to the second line 120 of the motor 100, configured to transmit the value of a second signal C2.

The two channels are connected to measurement channel selection resources, which in this case is a multiplexer 400. The measurement channel selection resources multiplexer 400 is configured to selectively transmit the value of the first C1 or of the second C2 signal to an analog/digital converter 320. The signal of output of the measurement channel selection resources is transmitted to the input of an analog/digital converter 320 via an appropriate channel.

The converter 320 is preferably also connected to memory resources 310, and optionally integrated into an electronic chip 300. The memory resources can be a set of registers 310 for example, and the whole can be integrated into the electronic chip 300.

Control resources (not shown) for the measurement channel selection resources allow the selective selection of either of the measurement channels 111, 121. Also preferably, the control resources of the multiplexer are integrated into the electronic chip 300.

Thus, the converter 320 performs the conversions according to the measurement channel selected by the multiplexer 400.

Figure 2:
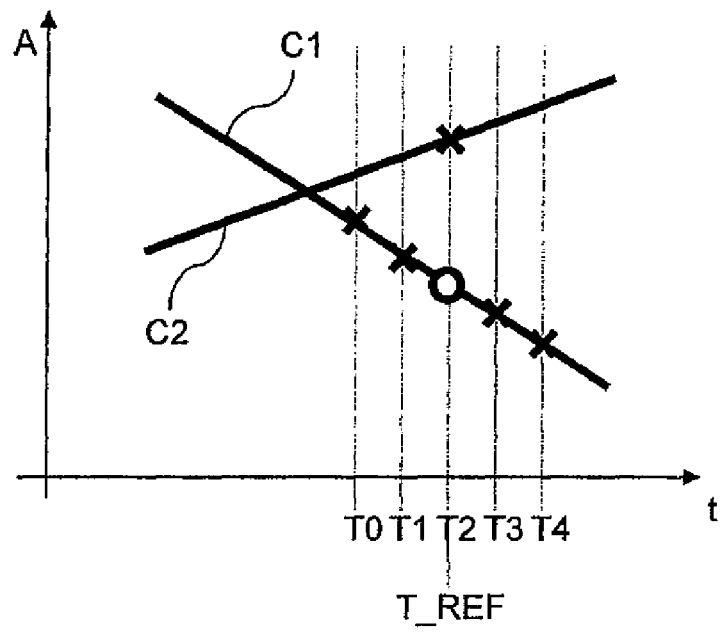
FIG. 2 is a schematic representation of the sampling of two analog signals.

FIG. 2 represents the variation with time of two signals, respectively C1 and C2, corresponding, for example, to the values of the signals transmitted on the two measurement channels 111, 121 respectively.

The measurements performed by the converter are effected at given times T0, T1, T2, etc. and correspond to successive sampling instants. These instants are preferably periodic and define a sampling frequency, which preferably, according to a preferred implementation, corresponds to the conversion times of the analog/digital converter, typically a few microseconds.

Still referring to FIG. 2, the creation of a digital sample representing the value taken by one of these signals at a sampling instant is represented by a cross.

At sampling instant T2, for example, the sampling is effected from signal C2. The impossibility of measuring the value of signal C1 at this reference instant T_REF by the converter is symbolized by a circle on this signal C1.

Each measurement on either of the signals defines a sampling point, and a succession of sampling points defines a sequence.

The solution includes a sequence of at least three sampling points, each point corresponding to an original digital sample.

Referring again to FIG. 2, there is a problem in approximating the value of signal C1 at the reference instant T_REF, which in this case is T2.

To this end, the solution presented herein is to combine at least two original digital samples, created for a first at least of the signals, which in this case is C1, at respective sampling instants, which in this case is at times T1 and T3, in order to form, by interpolation, a derived digital sample representing the value taken by this first signal at a reference instant, which in this case is T2, equal to T_REF, offset in time in relation to each of the sampling instants of this first signal.

$C_i(T_k)$ indicates the value taken by the signal $C_i$, where i=1 or 2, with the index representing the first or the second signal, at instant $T_k$, where k=0, 1, 2, ... N. Preferably, the measurements are effected periodically, meaning that for each k, the offset between $T_k$ and $T_{k-1}$ is constant.

Thus, in a sampling sequence at three points (T1, T2=T_REF, and T3 in FIG. 2), the value of the current for signal Ci at the reference instant T_REF can thus be interpolated, in the context of a linear approximation, by:

$$C1(T\_REF)=[C1(T1)+C1(T3)]/2 \qquad (1)$$

The sampling sequence in this case is then C1, C2, and C1. This means that a first sample is created on C1 at time T1, a second sample is created on C2 at time T2, and a third sample is created on C1 at time T3.

In order to simplify this present description, it is assumed that the reference time T_REF is equal to sampling time T2. In this case, the value of signal C2 at the reference time is the value of signal C2 measured by the converter at time T2, and the value of signal C1 at the reference time is the value calculated by interpolation according to equation (1) above.

Preferably, the solution comprises effecting a linear interpolation of signals C1 and C2 over a given time period, typically the sampling sequence. A non-linear interpolation can be performed, but necessitates calculations that are more complex and more expensive in terms of time to execute.

In one embodiment, the interpolation is performed by extrapolation. To illustrate this embodiment (not shown) with reference to FIG. 2 in an interpolation using three sampling points, the question is whether T_REF is more than T3 or less than T1. In this case, an interpolation model other than that corresponding to equation (1) is used. In the same vein, it is also possible to use a model that is weighted differently from equation (1), as described below at the equation (3), or, for example, if the sampling points are not equidistant, at the point corresponding to the reference instant.

In other embodiments, the interpolation is effected with more than three sampling points, such as with the five points of FIG. 2 for example, as described below. A large number of sampling points (large value of N) reduces the conversion noise (over-sampling) but increases the calculation time, and in addition, the number N of sampling points is dependent upon the computing power of the processor and on the speed of the sampler (in that the result of the measurement must not be excessively offset in time, at the risk of rendering unstable a system that is controlled by these measurements). Furthermore, the invention is based on the fact that the sinusoidal currents in the balanced three-phase motors can be considered to be linear over a relatively short time scale, typically 50 µs to 1 ms, depending on the inductance of the motor. This also restricts the maximum number of samples possible.

Figure 3:
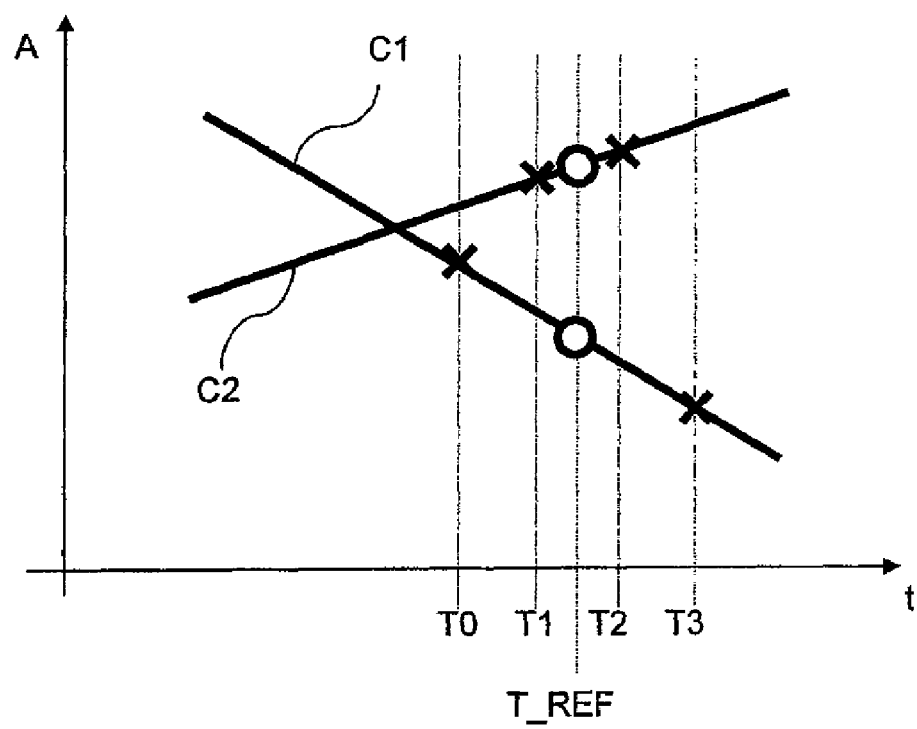
FIG. 3 is another schematic representation of the sampling of two analog signals.

Furthermore, as shown in FIG. 3, the reference instant T_REF cannot correspond to a sampling instant of one of the signals. The value of each of signals C1 and C2 can then be interpolated according to equation (1), and the sequence is then at least four sampling points, namely two points per signal.

In this case, the sampling sequence is then advantageously defined by C1, C2, C2, C1, as shown in FIG. 3.

Thus, the same equation (1) can be used for interpolating the value of each of the two signals C1 and C2 at the reference instant by:

$$C1(T\_REF)=[C1(T0)+C1(T3)]/2$$

$$C2(T\_REF)=[C2(T1)+C2(T2)]/2$$

As before, other combinations are possible for the interpolation, but the model corresponding to equation (1) is advantageously simple to implement and rapid in terms of calculation time.

Referring once more to FIG. 2, it is possible to define, for example, a sequence of five sampling points, which in this case is the sequence C1, C1, C2, C1, C1. And still using the model of equation (1), the value of C1 at the reference instant T_REF is interpolated by the equation:

$$C1(T2)=[C1(T0)+C1(T1)+C1(T3)+C1(T4)]/4 \qquad (2)$$

As before, other sequences and/or other combinations are possible, for example by grouping certain terms of equation (2) above. One embodiment for equation (2) can thus correspond to the following system of equations:

$$C'1=[C1(T0)+C1(T1)]/2$$

$$C1(T2)=[C'1+C1(T3)+C1(T4)]/3 \qquad (3)$$

The sequence used for the interpolation, meaning the order in which the measurements of both of the channels are effected, are recorded in memory resources 310. These memory resources 310 are registers of the converter 300 for example.

In another embodiment, the memory resources 310 can be transferred, by a Direct Memory Access (DMA) controller into the RAM of a processor for example, when the analog/digital converter 300 forms part of a microcontroller.

The sequence placed in memory, meaning a list of the conversions to be executed by the analog/digital converter 320, is used to control the selection of the corresponding measurement channel.

In one embodiment, a counter is used to indicate the length of the sequence, meaning the number of sampling points.

From the digital viewpoint, the number of bits corresponding to the coding of the analog values depends on the converter used and on the number of channels to be converted.

For example, if a converter can convert eight channels, then one needs only three bits to determine a conversion $8=2^3$. However, it is also possible to use four bits. In this case, the first three bits correspond to the eight channels, and the last bit indicates the end of a sequence, which in this case eliminates the need for the use of a counter. Likewise, if the converter can convert ten channels, four bits are necessary, corresponding to codes 0 to 15. In this case, codes 0 to 9 each corresponds to one channel respectively, and all codes greater than 9 correspond to the end of a sequence.

Furthermore, the model, such as the aforementioned equation (1), used for the interpolation is stored, for example, in the form of in-built software.

Preferably, like the model, the sequence used is dynamically programmable.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for measuring at least two analog signals, corresponding respectively to a first and a second phase of a three-phase motor, comprising:

creating, at successive sampling instants and at least by means of a first analog/digital converter, digital samples representing a value taken respectively by these two analog signals at these sampling instants, selectively supplying, at each sampling instant, either of the two analog signals to the first analog/digital converter to generate a corresponding original digital sample, combining at least two original digital samples, created for a first at least of the two analog signals at respective sampling instants, in order to form, by interpolation, a derived digital sample representing the value taken by this first analog signal at a reference instant that is offset in time in relation to each of the sampling instants of this first analog signal, and deducing from the derived digital sample value a value of a third phase of the three-phase motor, considering the motor as stable, at the reference instant.

2. The method according to claim 1, wherein deducing the value of the third phase of the three-phase motor comprises using both the derived digital sample value for the first analog signal and the original digital sample of a second analog signal in the deducing calculation.

3. The method according to claim 1, in wherein the reference instant is a sampling instant of a second of the analog signals.

4. The method according to claim 1, further including combining at least two original digital samples, created for a second of the analog signals at respective sampling instants, in order to form, by interpolation, a derived digital sample representing the value taken by this second analog signal at the reference instant.

5. The method according to claim 1, in wherein the interpolation is linear.

6. The method according to claim 1, in wherein at least one of the sampling instants used for the interpolation is prior to the reference instant.

7. The method according to claim 1, further comprising storing in memory a sequence that comprises selectively supplying, at each sampling instant, either of the two analog signals to the first converter for the creation of a corresponding original digital sample, and where the sequence is also capable of being modified dynamically.

8. The method according to claim 7, in wherein the memory resources include a set of registers of the first converter.

9. The method according to claim 7, in wherein the memory resources include random access memory of a processor that is connected to the first converter by a DMA controller.

10. The method according to claim 1, further comprising monitoring of phase currents of a balanced thee-phase device at a reference instant.

11. A device, including:
means for measuring at least two analog signals, configured to execute at least one operation that comprises creating, at successive sampling instants and at least by means of a first analog/digital converter, digital samples representing values taken respectively by these two analog signals at these sampling instants,
means for selectively supplying, at each sampling instant, either of the two analog signals to the first converter to generate a corresponding original digital sample,
means for combining at least two original digital samples, created for a first at least of the two analog signals at respective sampling instants, in order to form, by interpolation, a derived digital sample representing the value taken by this first analog signal at a reference instant that is temporally offset in relation to each of the sampling instants of this first analog signal, and
means for deducing from the derived digital sample a value of a third phase of a three-phase motor, considering the motor as stable, at the reference instant.

12. A method for measuring at least two analog signals using only a single analog/converter, comprising:
sampling a first one of the analog signals at a first instant in time to generate by the single analog/digital converter a first digital value;
sampling a second one of the analog signals at a second instant in time to generate by the single analog/digital converter a second digital value;
sampling the first one of the analog signals at a third instant in time to generate by the single analog/digital converter a third digital value; and
interpolating the first and third digital values relating to sampling of the first one of the analog signals at the first and third instants in time to derive a fourth digital value representing a sampling of the first one of the analog signals at about the second instant in time.

13. The method of claim 12 wherein the first, second and third instants in time are sampling instants which are periodic and defined by a sampling frequency.

14. The method of claim 12 wherein interpolating comprises linearly interpolating.

15. The method of claim 12 wherein interpolating comprises extrapolating.

16. The method of claim 12 wherein the first and second ones of the analog signals correspond to a first and a second phase of a three-phase motor, further comprising deducing a value of a third phase of the three-phase motor at about the second instant in time from the second and fourth digital values.

17. A method for measuring at least two analog signals using only a single analog/converter, comprising:
sampling a first one of the analog signals at a first and a second instants in time to generate by the single analog/digital converter a first and second digital value, respectively;
sampling a second one of the analog signals at a third and a fourth instants in time to generate by the single analog/digital converter a third and a fourth digital value, respectively;
first interpolating the first and second digital values relating to sampling of the first one of the analog signals at the first and second instants in time to derive a fifth digital value representing a sampling of the first one of the analog signals at a reference instant in time; and
second interpolating the third and fourth digital values relating to sampling of the second one of the analog signals at the third and fourth instants in time to derive a sixth digital value representing a sampling of the second one of the analog signals at about the same reference instant in time.

18. The method of claim 17 wherein the first through fourth instants in time are sampling instants which are periodic and defined by a sampling frequency.

19. The method of claim 17 wherein interpolating comprises linearly interpolating.

20. The method of claim 17 wherein interpolating comprises extrapolating.

21. The method of claim 17 wherein the first and second ones of the analog signals correspond to a first and a second phase of a three-phase motor, further comprising deducing a value of a third phase of the three-phase motor at about the reference instant in time from the fifth and sixth digital values.

22. The method of claim 17 wherein reference instant in time does not correspond with any of the first through fourth instants in time.

* * * * *

UNITED STATES PATENT AND TRADEMARK OFFICE
CERTIFICATE OF CORRECTION

PATENT NO.      : 7,477,174 B2
APPLICATION NO. : 11/761304
DATED           : January 13, 2009
INVENTOR(S)     : Vincent Onde It is certified that error appears in the above-identified patent and that said Letters Patent is hereby corrected as shown below:

In the Specification:

On the cover page of the patent, please delete the Abstract language in its entirety and replace with the following Abstract language:

> A method, and a device implementing the method, wherein a measurement is made of at least two analog signals. This measurement includes at least one operation which creates, at successive sampling instants and at least by means of a first analog/digital converter, digital samples representing the values taken respectively by these signals at these sampling instants. In accordance with the method, an operation includes selectively supplying, at each sampling instant, either of the signals to the first converter for the creation of a corresponding original digital sample. At least two original digital samples, created for a first at least of the signals at respective sampling instants, are combined in order to form, by interpolation, a derived digital sample representing the value taken by this first signal at a reference instant that is temporally offset in relation to each of the sampling instants of this first signal.

In the Claims:

At column 7, claim number 10, line number 37, please delete the word "thee-phase" and replace with the word --three-phase--.

Signed and Sealed this
Twenty-first Day of June, 2011

David J. Kappos
*Director of the United States Patent and Trademark Office*